United States Patent [19]
Moslehi

[11] Patent Number: 5,387,538
[45] Date of Patent: Feb. 7, 1995

[54] METHOD OF FABRICATION OF INTEGRATED CIRCUIT ISOLATION STRUCTURE

[75] Inventor: Mehrdad M. Moslehi, Dallas, Tex.

[73] Assignee: Texas Instruments, Incorporated, Dallas, Tex.

[21] Appl. No.: 941,383

[22] Filed: Sep. 8, 1992

[51] Int. Cl.⁶ ............................................. H01L 21/76
[52] U.S. Cl. ........................................ 437/67; 437/90
[58] Field of Search .................. 437/67, 72, 89, 90; 148/DIG. 50, DIG. 85, DIG. 86

[56] References Cited

U.S. PATENT DOCUMENTS

| | | | |
|---|---|---|---|
| 4,473,598 | 9/1984 | Ephrath et ál. | 437/90 |
| 4,847,214 | 7/1989 | Robb et al. | 437/67 |
| 4,942,137 | 7/1990 | Sivan et al. | 437/72 |
| 5,183,795 | 2/1993 | Ting et al. | 437/230 |
| 5,212,110 | 5/1993 | Pfeister et al. | 437/89 |

FOREIGN PATENT DOCUMENTS

| | | |
|---|---|---|
| 276959 | 8/1988 | European Pat. Off. |
| 57-211747 | 12/1982 | Japan |
| 61-281537 | 12/1986 | Japan |
| 1207945 | 8/1989 | Japan |
| 497519 | 3/1992 | Japan |

Primary Examiner—George Fourson
Attorney, Agent, or Firm—Jacqueline J. Garner; Richard L. Donaldson; William E. Hiller

[57] ABSTRACT

A method for forming semiconductor device isolation structures first defines a field isolation region (66) in a semiconductor substrate (60) and then forms a seed region layer (78) for receiving a selectively grown silicon island. Next, chemical-vapor-deposited silicon dioxide spacers (82) are formed along the sidewall of field isolation region (66). A selectively grown silicon island (84) is then formed within field isolation region (66) having a sufficient thickness for filling the remainder of field isolation region (66) upon the formation of field oxide region (88). After selectively removing silicon dioxide sidewalls (82), silicon island (84) is oxidized to form field oxide region (88) that fills field isolation (66) region. Seed region insulating layers (74 and 76) separate field oxide region (88) from semiconductor substrate (60). Following the formation of field oxide region (88), the resulting wafer is available for subsequent device fabrication processing.

14 Claims, 2 Drawing Sheets

METHOD OF FABRICATION OF INTEGRATED CIRCUIT ISOLATION STRUCTURE

TECHNICAL FIELD OF THE INVENTION

The present invention generally relates to integrated circuit fabrication technology and the results thereof, and more particularly to an integrated circuit isolation structure and fabrication method based on the use of selective silicon growth and sidewall spacer techniques to achieve a planar and scalable isolation structure.

BACKGROUND OF THE INVENTION

Integrated circuit chip manufacturers fabricate advanced semiconductor devices by different combinations of processes such as sequentially forming metals, oxides, doped semiconductor, and other materials in layers usually thinner than 1 μm thick and, then, etching away predetermined portions of the thin films from the semiconductor wafer. In these techniques, manufacturing process control and fabrication tolerance are important considerations. Moreover, as the integrated circuit packing density and chip size increase with each new technology generation, ensuring process control and satisfying fabrication tolerances become even more important requirements. Many conventional fabrication techniques and device structures, however, cannot easily meet these requirements.

One important aspect of forming semiconductor devices is the ability to electrically isolate each active component from other active components on the integrated circuit. While this is a critical consideration in Very-Large-Scale Integrated (VLSI) circuits and Ultra-Large-Scale Integrated (ULSI) circuits, traditional isolation structures are not easily scalable for use in sub-half-micron VLSI and ULSI technologies. There are numerous reasons why the conventional isolation techniques have not proven scalable down to the sub-half-micron regimes. For example, the widely used isolation method known as local oxidation of silicon (LOCOS) is a device isolation technique used to form isolation structures in integrated circuit devices. The LOCOS isolation, however, suffers from a limitation known as the formation of what is often called "bird's beak" regions at the isolation edge regions on the device. For example, FIG. 1 illustrates a conventional transistor device structure 10 that has a LOCOS-related bird's beak typical of most LOCOS-type isolation methods. Semiconductor device 10 uses silicon substrate 12 on which appears transistor gate structure 14 and silicon dioxide LOCOS isolation structures 16 over the field channel stop regions 18. Gate structure 14 includes gate electrode 20, gate dielectric 22 and spacers 24 over n-type lightly doped drain (LDD) 26 regions. The n-type LDD regions 26 are connected to the heavily doped source/drain junctions 28.

As FIG. 1 clearly illustrates, bird's beak 30 has associated bird's beak length, $L_{BB}$, which is defined by the field oxide region between the point 32 at which the field oxide thickness begins to decrease and the final point 34 adjacent the source/drain junctions 28. Bird's beak (30) forms a transition region of length $L_{BB}$ between the field isolation region and the active device region that is essentially non-usable in the device. The LOCOS-related bird's beak regions 30 result in the reduced device packing density due to the loss of a fraction of the substrate area available for circuit layout. Additionally, excessive diffusion and spread of the channel-stop implant 18 occurs and non-planar surface for device 10 results due to the thermal oxidation process used in the LOCOS-based isolation techniques.

FIG. 2 shows how a conventional LOCOS process forms the bird's beak regions. On semiconductor structure 11 appears LOCOS oxidation mask 13 that comprises a chemical-vapor-deposited silicon nitride layer 15 (oxidation mask) over a pad oxide layer 17. The pattern oxide mask 15 is used as an oxidation mask over substrate 12 and also masks the implantation of boron performed to form self-aligned channel stop regions 18. During a steam oxidation process after formation of the patterned LOCOS oxidation mask layer 15, patterned oxidation mask 13 protects a portion of silicon substrate 12 against thermal oxidation, while the remaining portions of substrate 12 (which have been implanted with channel-stop boron) form conventional field oxide isolation structure 16. Because this method employs a thermal oxidation process, the thermally grown field oxide layer penetrates underneath the patterned LOCOS mask 13 edge. As a result, LOCOS bird's beak regions 30 arise as an extended region beneath patterned LOCOS mask 13 (also resulting in the lifting of the nitride mask layer 15).

FIGS. 3a and 3b very simply show another phenomenon that occurs due to bird's beak formation that limits the usefulness of conventional LOCOS and modified LOCOS techniques. For example, given that a desired field isolation silicon oxide thickness may be 7000 Å such as shown in FIG. 3a, as the lateral dimension or width W of isolation structure 40 decreases (e.g., due to technology scaling) to the width W' as shown in FIG. 5b, the LOCOS-induced mechanical stresses and bird's beak regions cause a thinning of the maximum isolation field oxide thickness to below 7000 Å for a given thermal oxidation cycle. This is due to the fact that the LOCOS-induced stresses at the field corners reduce the overall field oxide thickness below the desired wide field values when the lateral field oxide isolation dimensions are scaled down to the sub-micron regime. This places a limit on the scaling of LOCOS type structures.

To overcome these problems, numerous alternative modified LOCOS techniques have been proposed. These include Sealed Interface LOCOS (SILO) and Poly-Buffered LOCOS (PBL) techniques, which are modified LOCOS techniques that seek to provide more scalable isolation structures which reduce the bird's beak phenomenon. Other modified LOCOS techniques have been suggested which employ a shallow silicon trench etch to form more planar isolation structures. This planarity, however, is obtained at the cost of increased stress-induced defect density in silicon. In general, these modified LOCOS techniques can produce a more planar isolation structure, but they result in higher active device stresses and more stress-induced defects in the transistor device regions. Also, they are not fully effective to eliminate the bird's beak problem.

Consequently, there is a need for an improved method to fabricate integrated circuit isolation structures that is not only scalable well into the sub-micron regime, but also avoids the bird's beak and stress problems of conventional LOCOS isolation techniques. In particular, the lateral dimensions of the isolation structure should be easily scalable to the critical dimensions of lithography resolutions limits for the sub-micron semiconductor device structures.

There is a need for a method and structure that avoid electrically-active defects in active device regions of integrated circuits. And, there is a need for an improved semiconductor device isolation structure fabrication process that can produce stress-free and defect-free active silicon regions.

There is a need for a fabrication method and structure which can produce device isolation structures with high-quality isolation/substrate interface regions for effective device-to-device electrical isolation at minimum isolation dimensions.

There is a further need for a method and structure to form integrated circuit isolation regions that avoids field-oxide thinning problems of conventional LOCOS techniques. Thus, as the lateral dimensions of the isolation regions are scaled down, there is a need for a method and structure that avoids the field-oxide thinning effects.

SUMMARY OF THE INVENTION

The present invention, accordingly, provides an integrated circuit isolation structure and fabrication method that overcomes and reduces disadvantages and limitations associated with prior methods of forming integrated circuit isolation structures and those associated with prior isolation structures themselves.

One aspect of the invention is a method for forming semiconductor device isolation structures as part of a fabrication process that includes the steps of first defining a field isolation region in a semiconductor substrate. Then, the process seeds a region of the field isolation region to define a seed region layer for selective silicon growth. Then, the method selectively grows a silicon island on the seed region layer. Then, the method forms a field region oxide from the selectively grown silicon island that fills the remaining segment of the field isolation region. Thereafter, the process proceeds with a deglaze of the semiconductor substrate prior to subsequent device fabrication process steps.

Yet another aspect of the present invention is an improved integrated circuit isolation structure for a semiconductor integrated circuit device that provides enhanced device characteristics. The structure includes a semiconductor substrate material and a field isolation region within the semiconductor substrate material. A seed region layer is formed within the field isolation region for subsequent formation of a selectively grown silicon island. The selectively grown silicon island is then oxidized to form a field oxide region which is integral to the final device structure. Upon completion of the above process, the substrate can be used for further integrated circuit processing.

A technical advantage of the present invention is that by using selective silicon growth in conjunction with sidewall spacer techniques, a planar and scalable isolation structure is formed that avoids the bird's beak problem and scaling limitations of the conventional LOCOS isolation processes. In the present invention, the lateral dimensions of the isolation regions are easily scalable to the critical dimensions of lithography techniques for sub-micron integrated circuit device fabrication.

Another technical advantage of the present invention is that by avoiding the LOCOS-related silicon dioxide volume expansion that occurs in LOCOS isolation techniques, stress-free and defect-free active devices and moat regions in semiconductor devices are obtained. By avoiding the need for LOCOS or modified-LOCOS isolation techniques, the present invention successfully avoids generation of defects in the active device regions.

Yet another technical advantage is that by using selective silicon growth and sidewall spacer techniques, the present invention avoids the field-oxide thinning problem typical of the LOCOS isolation processes.

Yet another technical advantage of the present invention is significantly improved control over the final field isolation structure thickness. The present invention permits a wide range of field oxide thicknesses without any trade-offs which can lead to the degradation of other important device parameters such as electrical isolation and surface planarity. Further, the present invention provides the ability to have large field threshold voltages for field parasitic transistors. This insures excellent device-to-device electrical isolation.

Yet another important technical advantage is that by avoiding the isolation structure topography typical of LOCOS and modified-LOCOS techniques, surfaces result that have excellent planarity. Therefore, in a simple and repeatable process, the present invention provides high-quality field isolation regions with a good isolation/substrate electrical interface that allows butting or interfacing the active device junctions directly against the field oxide isolation sidewall. This improves chip packing density and permits self-alignment of channel stop implant regions.

Yet a further technical advantage of the present invention is that it is fully compatible with existing VLSI and ULSI device technologies.

BRIEF DESCRIPTION OF THE DRAWINGS

The invention and its modes of use and advantages are best understood by reference to the following description of illustrative embodiments when read in conjunction with the accompanying drawings, wherein.

DETAILED DESCRIPTION OF THE INVENTION

The preferred embodiment of the present invention is best understood by referring to the FIGUREs, wherein like numerals are used for like and corresponding parts of the various drawings.

The preferred embodiment provides an improved device isolation technology for advanced VLSI/ULSI device fabrication. This isolation technology is based on the use of silicon trench etch, selective silicon growth (SSG), and sidewall spacer formation techniques and results in formation of planar, stress-free, and scalable isolation structures. The SSG regions/islands and sidewall polysilicon are thermally oxidized to form the planar isolation regions. The field oxide/substrate interface is a high-quality thermal oxide interface. Moreover, the fabrication process flow allows self-aligned channel stop formation as in the conventional LOCOS processes. This new isolation technology is easily scalable for applications in submicron and sub-0.5 micron semiconductor technologies and does not suffer from many limitations of the conventional LOCOS and modified LOCOS device isolation techniques.

Figure 1:
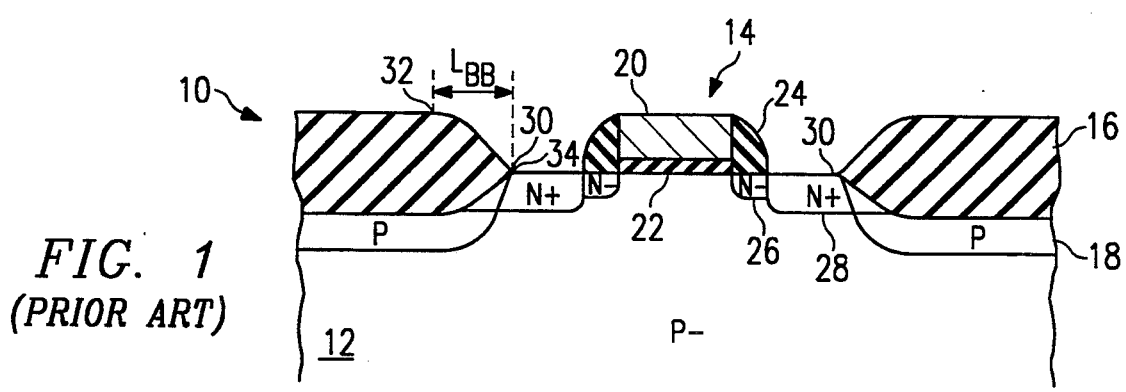
FIG. 1 provides an illustrative example of a side view of an insulated-gate field-effect transistor with conventional LOCOS isolation showing the problem of bird's beak in such isolation structures.
Figure 2:
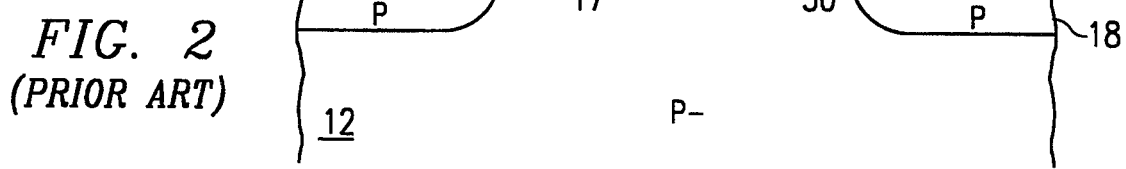
FIG. 2 illustrates the formation of isolation bird's beak in LOCOS isolation structures.
Figure 3A:
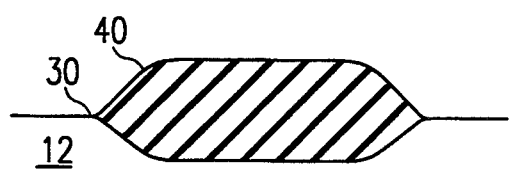
FIGS. 3a and 3b illustrate the field-oxide thinning problem of conventional LOCOS fabrication methods caused by lateral field oxide width scaling.
Figure 3B:
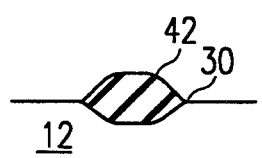
Figure 4:
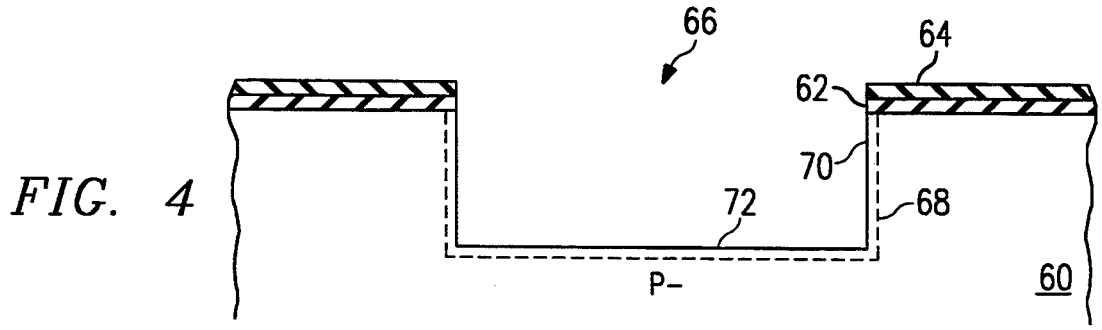
FIG. 4 shows a conceptual depiction of the field isolation region definition of the preferred embodiment.

To understand the fabrication process flow to form the improved isolation structure, FIG. 4 illustrates the process of defining a field isolation shallow silicon trench region for device 50 within a semiconductor substrate material according to the preferred embodiment. Referring to FIG. 4, the process flow of the preferred embodiment begins by depositing or growing on substrate material 60 a thin silicon dioxide layer 62 that has a thickness of approximately 250 Å. Then, on silicon dioxide layer 62, silicon nitride layer 64 is deposited by LPCVD or PECVD to a thickness of approximately 1,000 Å. Next, a photolighography step is performed to define the field isolation region, and a shallow trench is etched into silicon substrate 60 to form field isolation region 66. The depth of field isolation region 66 shallow trench is nearly the same as the desired thickness of the final field oxide for the final isolation structure, as described below. Next, a channel stop region 68 is formed by ion implantation of boron (P-type) or phosphorous (N-type) in the sidewalls 70 and bottom 72 of field isolation region 66. Channel stop 68 is a low-energy medium-dose implant including an angle implant of boron or phosphorus on the surfaces of field isolation region 66. Alternatively, a solid dopant source layer may be deposited and then annealed to provide doped channel stop region 68. The solid dopant source layer may then be stripped to leave the channel stop region 68 for field isolation region 66. Furthermore, a gas-phase doping step (with or without plasma) may be used to form field isolation channel stop region 68.

Figure 5:
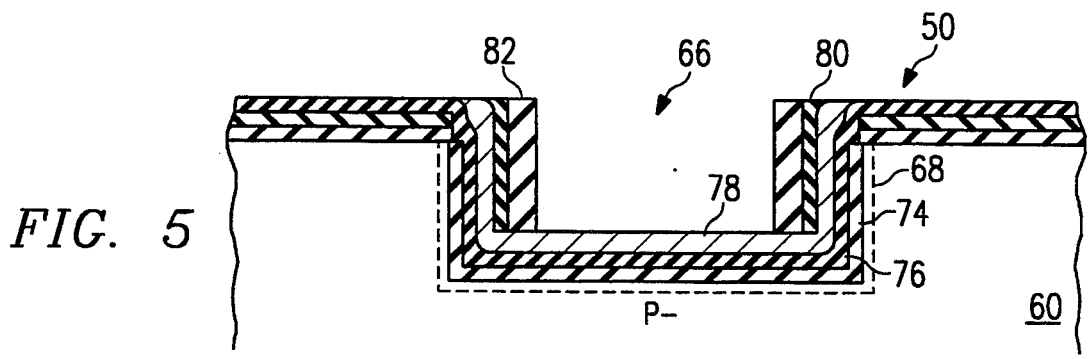
FIG. 5 depicts the seed region layer definition for selective silicon growth in the preferred embodiment.

FIG. 5 illustrates the next step of the method of the preferred embodiment which establishes a seed region in device 50 for selective silicon growth. Accordingly, FIG. 5 first forms a thin thermal oxide layer 74 within field isolation regions 66 on the exposed surfaces of the sides and bottom of the field isolation region 66 via thermal oxidation. This is followed by depositing a thin nitride layer 76 having a thickness of between 100 and 400 Å. Then, thin doped polysilicon or amorphous silicon layer 78 is deposited to a thickness of approximately 200 to 1,000 Å. Silicon nitride layer ($Si_3 N_4$) 80 is deposited to a thickness of between 100 to 500 Å and then anisotopically etched using a reactive ion etch (RIE) process. The RIE process removes silicon nitride layer 80 from the top surface and trench bottom where it exposes polysilicon 78. This process exposes polysilicon layer at the bottom of field isolation region 66. Next, a layer of chemical-vapor-deposited silicon dioxide is deposited followed by a reactive-ion etch process to make oxide sidewalls 82. The thickness of oxide sidewalls 82 may be optimized for the desired width of the isolation structure.

Figure 6:
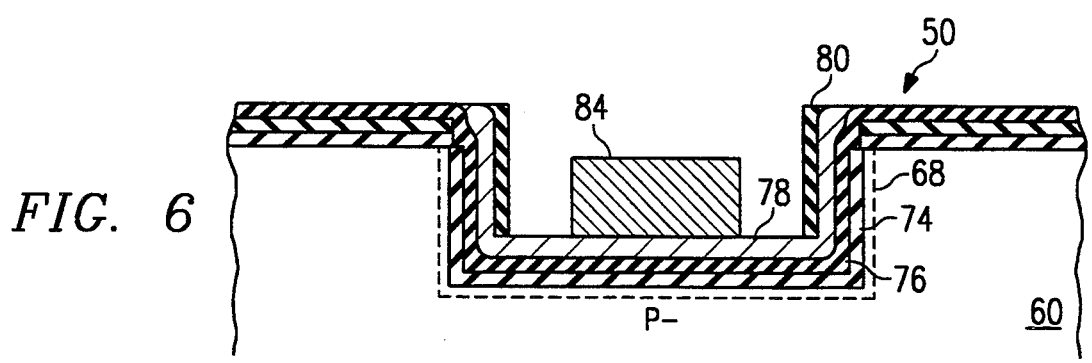
FIG. 6 conceptually illustrates the formation of a selectively grown silicon island according to the preferred embodiment.

In FIG. 6, the important step of forming the selectively grown silicon island is illustrated. Polysilicon or amorphous silicon island 84 is deposited using a selective silicon growth technique within field isolation region 66 over the exposed polysilicon seed layer 78. Controlling the thickness of silicon island 84 is necessary so that the final structure will become planar. This requires that the surface of the selective silicon growth should be below the top of the device 50 surface. The next step of the silicon island formation is to selectively remove sidewall oxide 82 and thereby form air gaps 86 between silicon island 84 and silicon nitride sidewall 80. This permits expansion of polysilicon or amorphous silicon, whichever is used, in the next thermal oxidation process step of the preferred embodiment.

Figure 7:
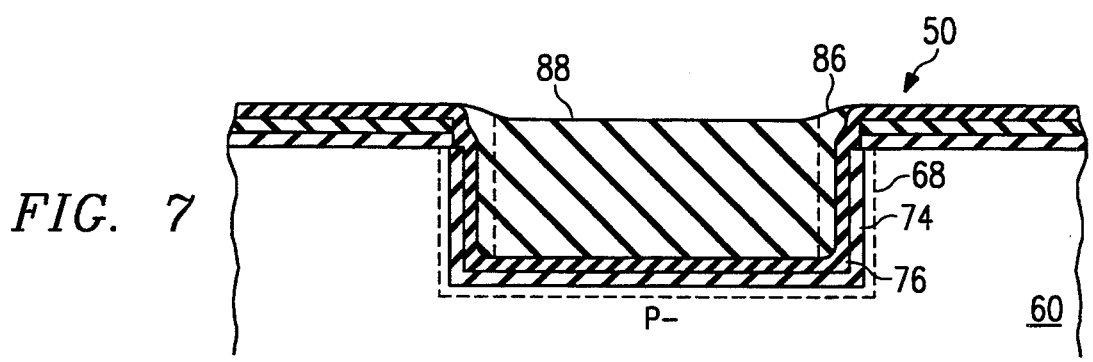
FIG. 7 illustrates formation of a semiconductor device field oxide region according to the preferred embodiment.

FIG. 7 shows the effect of the field thermal oxidation step of the preferred embodiment. This step completes the field isolation region formation and at the same time consumes silicon nitride sidewalls 80. As shown by perforated line 88 a first field thermal oxidation is performed on selectively grown silicon island 84 which not only consumes silicon nitride sidewall 80, but also consumes polysilicon layer 78. The sidewall polysilicon layer 78 and the selectively grown silicon island fuse together following the thermal oxidation step to fully fill field isolation region 66. This occurs due to the fact that there is volume expansion during thermal oxidation. Once this occurs, silicon nitride layer 76 prevents further oxidation of silicon substrate adjacent the field isolation region 66. Since the selective grown silicon island 84 is polysilicon or amorphous silicon, its oxidation rate is faster than that of pure silicon. The oxidation itself, therefore, becomes self-limiting at this point in the process flow.

Figure 8:
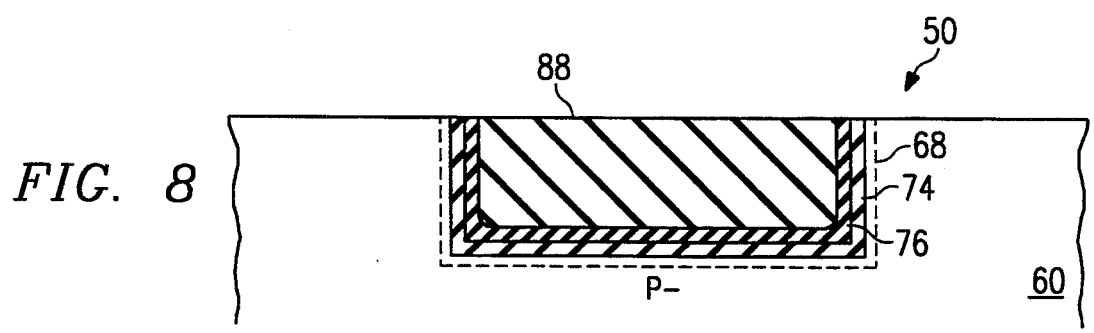
FIG. 8 describes the preferred embodiment's step of preparing active device islands separated by isolation regions for further processing by disposing of the top layers as necessary to expose the remaining active device regions for further device processing.

FIG. 8 shows the step of preparing the active device islands by removing all disposable layers of device 60 to expose the active device regions. This step entails performing a short wet deglaze to remove approximately 1,000 Å of silicon dioxide. Then, an isotropic (i.e., hot phosphoric acid) etch is used to strip away silicon nitride layer 64. Finally, another deglaze is performed to remove thin oxide layer 62 from the active device regions. The isolation process of the present invention is then complete and the remainder of the device processing proceeds according to standard device fabrication flow. For example, sacrificial oxide growth and strip, gate oxidation, polysilicon gate depositions, etc., may occur according to conventional methods as appropriate for the particular application of interest.

In the process of the preferred embodiment, the thickness of sidewall oxide layer 82 and selective silicon growth island 84 are optimized in order to obtain a planar void-free field oxide structure without any stress or defects in the active device regions. One major advantage of this isolation technology over conventional silicon epaxial growth techniques is the fact that the process of the present invention allows fabrication of high-performance active devices in the bulk silicon substrate 60. The quality of selectively grown silicon island 82 is not critical, because it is consumed for the field oxide isolation region. The sidewall polysilicon layer and/or the selectively grown silicon island 84 may be in-situ doped in order to reduce the oxide flow temperature and facilitate the fusing of the sidewall polysilicon oxide and the selectively grown silicon island oxide when they are fully grown towards the end of field oxidation cycle. This fusing is not essential. If a gap remains after the thermal oxidation cycle, it can be easily filled with an oxide deposition and etch back process.

The isolation process of the preferred embodiment does not produce any electrically-active defects in the active device regions. Since the lateral dimensions of the isolation regions are scaled down, there is no field-oxide thinning effect. As improved technology requires a wide range of field oxide thicknesses and lateral dimensions, the preferred embodiment meets the needs without degrading the other important features such as electrical isolation and surface planarity. The isolation technology of the preferred embodiment provides large field threshold voltages for excellent electrical isolation of devices. The improved isolation technique is capable of providing planar surfaces with negligible surface topography. This allows butting or interfacing the active device junctions directly against the field oxide sidewalls to result in efficient chip layout and packing density.

In summary, the method of the preferred embodiment forms semiconductor device isolation structures as part of the fabrication process by defining a field isolation region in a semiconductor substrate, and then forming a seed region layer to precipitate selective silicon growth within the field isolation region, and then selectively growing a silicon island on the seed region layer, and then forming a field oxide from the silicon island in the field isolation region that is isolated from the remaining portion of the silicon substrate, and then etching the silicon substrate to yield a wafer for further fabrication processing as appropriate.

Although the invention has been described with reference to the above specified embodiments, this description is not meant to be construed in a limiting sense. Various modifications of the disclosed embodiment, as well alternative embodiments, as well as alternative embodiments of the invention will become apparent to persons skilled in the art upon reference to the above description. It is therefore, contemplated that the appended claims will cover such modifications that fall within the true scope of the invention.

What is claimed is:

1. A method for forming a semiconductor device isolation structure, comprising the steps of
   (a) forming a trench field isolation region in a semiconductor substrate;
   (b) forming a buffer layer within said trench field isolation region;
   (c) forming a seed region layer within said trench field isolation region and over said buffer layer;
   (d) forming a disposable sidewall spacer in said field isolation region;
   (e) selectively growing a semiconductor island on said seed region layer, wherein said disposable sidewall spacer limits the lateral dimensions of said semiconductor island;
   (f) removing said disposable sidewall spacer to create air gaps laterally adjacent said semiconductor island; and
   (g) oxidizing said semiconductor island to form a field oxide region separated from said semiconductor substrate by said buffer layer.

2. The method of claim 1, wherein said semiconductor island selectively growing step comprises the step of growing said semiconductor island from a silicon semiconductor material.

3. The method of claim 1, wherein said buffer layer forming step comprises the step of forming said buffer layer of a thermally grown silicon dioxide layer.

4. The method of claim 1, wherein said buffer layer forming step comprises the step of forming said buffer layer of a stacked structure of a silicon nitride layer on a thermally grown silicon dioxide layer.

5. The method of claim 1, wherein said seed region layer forming step comprises the step of forming said seed region layer of a polycrystalline silicon layer.

6. The method of claim 1, wherein said seed region layer forming step comprises the step of forming said seed region layer of an amorphous silicon layer.

7. The method of claim 1, wherein said oxidizing step further comprises thermally oxidizing said semiconductor island in a process ambient consisting of steam.

8. The method of claim 1, further comprising the step of performing a selective etch process on said semiconductor substrate for subsequent device fabrication processing.

9. The method of claim 1, further comprising the step of forming a silicon nitride sidewall in said field isolation region for laterally separating said sidewall spacer from said seed region layer and said buffer layer.

10. The method of claim 1, further comprising the step of forming said buffer of at least one layer of silicon dioxide.

11. The method of claim 10, further comprising the step of forming a silicon nitride layer over said trench field isolation region as part of said buffer layer structure.

12. The method of claim 1, wherein the step of forming said trench field isolation region comprises masking a predetermined portion of said semiconductor substrate and etching a first portion of a surface layer of said semiconductor substrate and unmasking said predetermined portion of said semiconductor substrate.

13. The method of claim 1, further comprising the step of implanting said trench field isolation region with a dopant to form a channel stop region within said semiconductor substrate.

14. The method of claim 1, further comprising the step of doping said semiconductor island to form a doped field oxide isolation region from said doped semiconductor island.

* * * * *